United States Patent
Kim et al.

(10) Patent No.: US 9,972,744 B2
(45) Date of Patent: May 15, 2018

(54) LIGHT EMITTING DIODE AND DISPLAY DEVICE INCLUDING THE SAME

(71) Applicant: SAMSUNG DISPLAY CO., LTD., Yongin-si, Gyeonggi-do (KR)

(72) Inventors: Dong Chan Kim, Gunpo-si (KR); Dong Kyu Seo, Suwon-si (KR); Yoon Hyeung Cho, Yongin-si (KR); Won Suk Han, Yongin-si (KR)

(73) Assignee: Samsung Display Co., Ltd., Yongin-si, Gyeonggi-do (KR)

( * ) Notice: Subject to any disclaimer, the term of this patent is extended or adjusted under 35 U.S.C. 154(b) by 0 days. days.

(21) Appl. No.: 15/407,930

(22) Filed: Jan. 17, 2017

(65) Prior Publication Data

US 2017/0229606 A1    Aug. 10, 2017

(30) Foreign Application Priority Data

Feb. 5, 2016    (KR) .................. 10-2016-0015265

(51) Int. Cl.

| | |
|---|---|
| *H01L 33/00* | (2010.01) |
| *H01L 33/06* | (2010.01) |
| *H01L 33/26* | (2010.01) |
| *H01L 33/14* | (2010.01) |
| *H01L 33/18* | (2010.01) |
| *H01L 51/50* | (2006.01) |
| *H01L 27/15* | (2006.01) |
| *H01L 27/28* | (2006.01) |
| *H01L 27/32* | (2006.01) |
| *H01L 33/28* | (2010.01) |

(52) U.S. Cl.
CPC ............ *H01L 33/002* (2013.01); *H01L 27/15* (2013.01); *H01L 27/286* (2013.01); *H01L 27/3244* (2013.01); *H01L 33/06* (2013.01); *H01L 33/14* (2013.01); *H01L 33/18* (2013.01); *H01L 33/26* (2013.01); *H01L 51/5056* (2013.01); *H01L 51/5072* (2013.01); *H01L 33/28* (2013.01)

(58) Field of Classification Search
CPC ....... H01L 33/002; H01L 33/06; H01L 33/14; H01L 33/18; H01L 33/26
See application file for complete search history.

(56) References Cited

U.S. PATENT DOCUMENTS

| | | | | |
|---|---|---|---|---|
| 6,534,784 B2 * | 3/2003 | Eliasson | ................ | B82Y 20/00 136/206 |
| 2011/0291071 A1 | 12/2011 | Kim et al. | | |
| 2014/0175440 A1 * | 6/2014 | Mohammed | ............ | H01L 33/16 257/52 |

FOREIGN PATENT DOCUMENTS

| | | |
|---|---|---|
| JP | 2004-031323 A | 1/2004 |
| KR | 10-2007-0074257 A | 7/2007 |
| KR | 10-2010-0043994 A | 4/2010 |

* cited by examiner

*Primary Examiner* — Matthew Reames
(74) *Attorney, Agent, or Firm* — Lee & Morse, P.C.

(57) ABSTRACT

A light emitting element includes a first electrode, a second electrode overlapping the first electrode, and an emission layer between the first electrode and the second electrode. The emission layer includes a quantum well that includes a first layer and a second layer, each having a different band gap. The first layer includes magnesium, and the second layer includes zinc. The first layer and the second layer are amorphous.

20 Claims, 3 Drawing Sheets

LIGHT EMITTING DIODE AND DISPLAY DEVICE INCLUDING THE SAME

CROSS-REFERENCE TO RELATED APPLICATION

Korean Patent Application No. 10-2016-0015265, filed on Feb. 5, 2016, in the Korean Intellectual Property Office, and entitled: "Light Emitting Diode and Display Device Including the Same," is incorporated by reference herein in its entirety.

BACKGROUND

Embodiments relate to a light emitting element and a display device including the same.

SUMMARY

Embodiments are directed to a light emitting element including a first electrode, a second electrode overlapping the first electrode, and an emission layer between the first electrode and the second electrode. The emission layer includes a quantum well that includes a first layer and a second layer, each having a different band gap. The first layer includes magnesium, and the second layer includes zinc. The first layer and the second layer are amorphous.

The emission layer includes three or more odd-numbered layers formed by alternately layering the first layer and the second layer.

The first layer may be the bottommost and the topmost layer of the plurality of layers.

The first layer may be at least one selected from MgTe, MgSe, MgS, and MgO.

The second layer may be at least one selected from ZnTe, ZnSe, ZnS, and ZnO.

The second layer may further include at least one of magnesium and beryllium.

The second layer may be at least one selected from MgZnTe, MgZnSe, MgZnS, MgZnO, BeZnTe, BeZnSe, BeZnS, and BeZnO.

The second layer may include at least one of cadmium, mercury, strontium, and barium.

The second layer may be at least one selected from CdZnTe, CdZnSe, CdZnS, CdZnO, HgZnTe, HgZnSe, HgZnS, HgZnO, SrZnTe, SrZnSe, SrZnS, SrZnO, BaZnTe, BaZnSe, BaZnS, and BaZnO.

The light emitting element may further include a hole transport layer between the first electrode and the emission layer, and an electron transport layer between the second electrode and the emission layer.

At least one of the hole transport layer and the electron transport layer may include an inorganic material.

The hole transport layer may include at least one of CuI, CuBr, CuCl, AgI, AgBr, AgCl, AuI, AuBr, and AuCl. The at least one of CuI, CuBr, CuCl, AgI, AgBr, AgCl, AuI, AuBr, and AuCl may be doped with at least one selected from O, Se, S, and Te. T The hole transport layer may include at least one of ZnTe, ZnSe, ZnS, and ZnO. The at least one of ZnTe, ZnSe, ZnS, and ZnO may be doped with at least one selected from N, P, As, Sb, and Bi.

The electron transport layer may include at least one of ZnTe, ZnSe, ZnS, and ZnO. The at least one of ZnTe, ZnSe, ZnS, and ZnO is doped with at least one selected from B, Al, Ga, In, and Tl.

Embodiments are also directed to a display device including a substrate, a transistor on the substrate, and a light emitting element connected with the transistor. The light emitting element may include a first electrode, a second electrode that overlaps the first electrode, and an emission layer between the first electrode and the second electrode. The emission layer may include a quantum well including a first layer and a second layer, each having a different band gap. The first layer may include magnesium. The second layer may include zinc. The first layer and the second layer may be amorphous.

The emission layer may include three or more odd-numbered layers formed by alternately stacking the first layer and the second layer.

The first layer may include at least one selected from MgTe, MgSe, MgS, and MgO.

The second layer may include at least one selected from ZnTe, ZnSe, ZnS, ZnO, MgZnTe, MgZnSe, MgZnS, MgZnO, BeZnTe. BeZnSe, BeZnS, BeZnO, CdZnTe, CdZnSe, CdZnS, CdZnO, HgZnTe, HgZnSe, HgZnS, HgZnO, SrZnTe, SrZnSe, SrZnS, SrZnO, BaZnTe, BaZnSe, BaZnS. and BaZnO.

The display device may further include a hole transport layer between the first electrode and the emission layer and an electron transport layer between the second electrode and the emission layer.

At least one of the hole transport layer and the electron transport layer may include an inorganic material.

The hole transport layer may include at least one of CuI, CuBr, CuCl, AgI, AgBr, AgCl, AuI, AuBr, and AuCl. The at least one of CuI, CuBr, CuCl, AgI, AgBr, AgCl, AuI, AuBr, and AuCl may be doped with at least one selected from O, Se, S, and T. The hole transport layer may include at least one of ZnTe, ZnSe, ZnS, and ZnO, The at least one of ZnTe, ZnSe, ZnS, and ZnO may be doped with at least one selected from N, P, As, Sb, and Bi. The electron transport layer may include at least one of ZnTe, ZnSe, ZnS, and ZnO. The at least one of ZnTe, ZnSe, ZnS, and ZnO may be doped with at least one selected from B, Al, Ga, In, and Tl.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
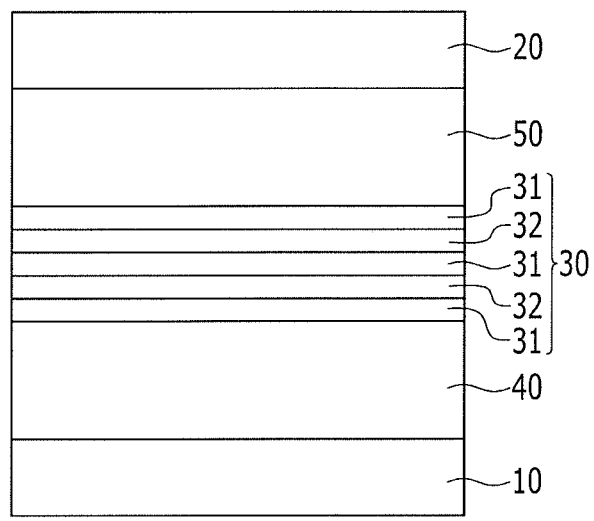
FIG. 1 illustrates a cross-sectional view of a light emitting element according to an exemplary embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. Like reference numerals refer to like elements throughout.

FIG. 1 illustrates a cross-sectional view of a light emitting element according to an exemplary embodiment. Referring to FIG. 1, a light emitting element may include a first electrode 10, a second electrode 20 that overlaps the first electrode 10, and an emission layer 30 provided between the first electrode 10 and the second electrode 20.

The emission layer 30 may be formed of a plurality of layers. The emission layer 30 may be a multi-layered quantum well having a structure in which a first layer 31 including magnesium and a second layer 32 including zinc are alternately layered.

In the multi-layered quantum well, the first layer 31 may be a barrier layer that functions as an energy barrier, while the second layer may be a well layer where electrons and holes injected to the emission layer 30 are re-combined. Light emission may occur in the second layer 32. When the emission layer 30 is a multi-layered quantum well, a band gap of the first layer 31 may be greater than a band gap of the second layer 32. The holes and electrons injected into the emission layer 30 may be collected in the second layer 32 such that light emission mainly occurs in the second layer 32. Each layer of the emission layer 30 may be amorphous.

A stacking sequence of the multi-layered quantum well that forms the emission layer 30 may be as follows. The first layer 31 may be stacked as the undermost layer, the second layer 32 may be stacked on the first layer 21, and then the first layer 31 may be stacked on the second layer 32. The multi-layered quantum well that forms the emission layer 30 may be formed by alternately stacking the first layer 31 and the second layer 32 in a sequential manner, and such a sequential stacking may be repeated. In this case, the first layer 31 having a larger band gap may be disposed as the bottommost layer and the topmost layer.

The two first layers 31 that are disposed opposing each other with reference to the second layer 32 may be the same layers, for example having the same materials and the same band gap. In some implementations, a first layer 31 disposed below a second layer 32 and a first layer 31 disposed above the second layer 31 may be made of different materials and may have different band gaps. Like the first layer 31, the two second layers 32 disposed opposing each other with reference to the first layer 31 may the same layers, for example, having the same materials and the same band gap. In some implementations, a second layer 32 disposed below a first layer 31 and a second layer 32 disposed above the first layer 31 may be made of different materials and may have different band gaps.

A thickness of the first layer 31 may be between 1 nm and 5 nm, and a thickness of the second layer 32 may be between 5 nm and 20 nm.

In FIG. 1, but. The emission layer 30 may be formed by stacking at least three layers. The number of emission layers 30 may be an odd number greater than or equal to 3. For example, as shown in FIG. 1, the emission layer 30 may be formed of five layers. The structure of the emission layer 30 will be described below in detail.

The first electrode 10 may be an anode and the second electrode 20 may be a cathode. The first electrode 10 may be an electrode that injects holes into the emission layer 30 when the first electrode 10 receives a current. The first electrode 10 may include a material that has a high work function. The second electrode 20 may inject electrons into the emission layer 30 when the second electrode 20 receives a current. The second electrode 20 may include a material that has a low work function. In some implementations, the first electrode 10 may be a cathode and the second electrode 20 may be an anode.

The first electrode 10 and the second electrode 20 may be transparent electrodes. The first electrode 10 and the second electrode 20 may be formed to have a thin thickness using a conductive oxide such as indium tin oxide (ITO), indium zinc oxide (IZO), zinc tin oxide (ZTO), copper indium oxide (CIO), copper zinc oxide (CZO), gallium zinc oxide (GZO), aluminum zinc oxide (AZO), tin oxide ($SnO_2$), zinc oxide (ZnO), or a combination thereof, a conductive polymer such as calcium (Ca), ytterbium (Yb), aluminum (Al), silver (Ag), magnesium (Mg), samarium (Sm), titanium (Ti), gold (Au), or an alloy thereof, graphene, carbon nanotubes, or PEDOT: PSS. The first electrode 10 and the second electrode 20 may have a structure in which two or more layers are stacked.

The emission layer 30 may be a quantum well in which the first layer 31 including magnesium and the second layer 32 including zinc are alternately stacked in plural. For example, the emission layer 30 may include three or more odd-numbered layers.

The emission layer 30 may be formed through a thermal evaporation method. A temperature of a substrate where a material is deposited for acquiring the amorphous emission layer 30 may be set to be lower than 100° C. For example, the temperature of the substrate may be set to be lower than 50° C. In a typical heat evaporation method, when a temperature of the substrate where a material is deposited facing a source is decreased, the deposited material cannot be crystalized and thus remains in an amorphous state.

In the exemplary embodiment, the emission layer 30 includes three or more odd-numbered layers. For example, as shown in FIG. 1 the emission layer 30 may be a quantum well formed by alternately stacking a first layer 31 including magnesium and a second layer 32 including zinc. Each layer of the emission layer 30 may be amorphous.

The first layer 31 may include at least one selected from MgTe, MgSe, MgS, and MgO.

The second layer 32 may include at least one selected from ZnTe, ZnSe, ZnS, ZnO, and an alloy thereof.

A band gap of the first layer 31 may be greater than a band gap of the second layer 32. Thus, electrons and holes injected into the emission layer 30 may be confined in the second layer 32 such that a quantum well may be formed. The combination of the electrons and the holes that are confined in the second layer 32 may generate light emission. When the density of the electrons and holes is increased in the second layer 32 of the emission layer 30 by the quantum well, highly effective light emission may occur.

Figure 2:
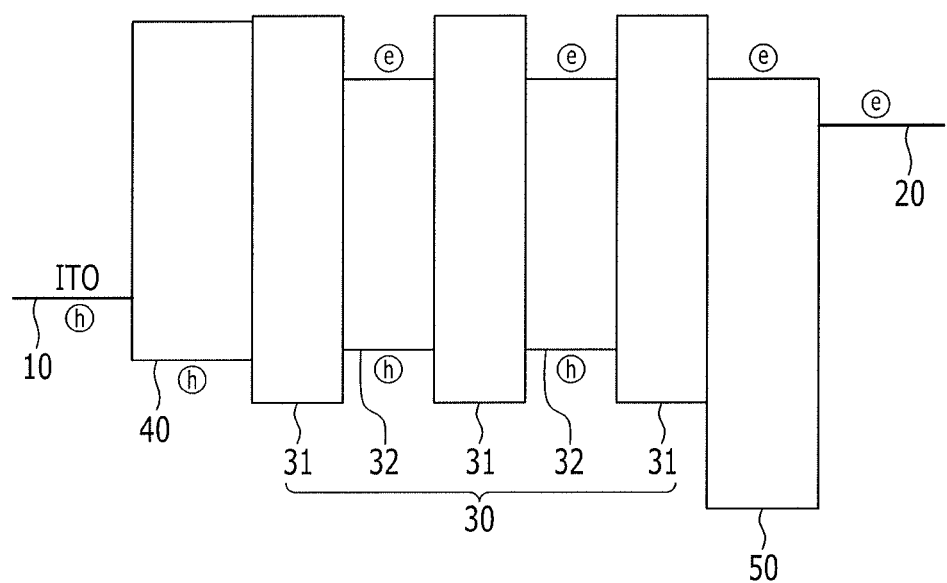
FIG. 2 illustrates a schematic diagram depicting an energy level of each layer of the light emitting element according to the exemplary embodiment.

FIG. 2 illustrates a schematic diagram of an energy level of each layer that forms the light emitting element according to the exemplary embodiment.

Referring to FIG. 2, the second layer 32 may be disposed between two first layers 31, each having a relative greater band gap. Electrons injected from the second electrode 20 and holes injected from the first electrode 10 may be collected in the second layer 32. The emission layer 30 includes a quantum well due to the sequentially stacked the first layers 31, each having a relatively greater band gap, and the second layer 32.

The first layer 31 and the second layer 32 may be made of an amorphous inorganic material. For example, all the layers that form the emission layer 30 may be made of amorphous inorganic materials. Unlike an organic light emitting element that emits light with a dopant and a host material included in an organic material, the light emitting element according to the present exemplary embodiment may emit light from an inorganic emission layer having an amorphous quantum well structure.

A general inorganic light emitting element may emits light from an emission layer, but the inorganic light emitting element is capable of only dot light emission and is weak to a crystal defect because the emission layer and other portions of the element are formed to be monocrystalline. However, the emission layer 30 of the light emitting element according to the exemplary embodiment is not weak to the crystal defect because the emission layer 30 made to be amorphous includes an inorganic material, and accordingly, the emission layer 30 is resistant to heat, moisture, and the like, has a long life span, and is capable of surface light emission.

The quantum well is formed only when the band gap of the first layer 31 is greater than that of the second layer 32. The band gap of the first layer 31 of the band gap of the second layer 32 may be adjusted using an alloy.

For example, the second layer 32 may include a compound that is an alloy of a compound that includes zinc, such as ZnTe, ZnSe, ZnS, and ZnO, with another metal.

For example, when at least one of magnesium and beryllium is alloyed to the second layer 32 that includes zinc, the band gap of the second layer 32 may be increased. The second layer 32 may be one selected from, for example, MgZnTe, MgZnSe, MgZnS, MgZnO, BeZnSe, BeZnSe, BeZnS, and BeZnO.

When at least one selected from cadmium (Cd), mercury (Hg), strontium (Sr), and barium (Ba) is alloyed to the second layer 32 that includes zinc, the band gap of the second layer 32 may be decreased.

In this case, the second layer 32 may be at least one selected from CdZnTe, CdZnSe, CdZnS, CdZnO, HgZnTe, HgZnSe, HgZnS, HgZnO, SrZnTe, SrZnSe, SrZnS, SrZnO, BaZnTe, BaZnSe, BaZnS, and BaZnO, as examples.

Such an increase or decrease of the band gap of the second layer 32 may be appropriately performed to balance hole injection efficiency and electron injection efficiency or to control a light emission color.

A material that is combined with magnesium in the emission layer 30 and a material that is combined with zinc in the second layer 32 may be the same. For example, in one element, a negative ion of the compound that forms the first layer 31 and a negative ion of the compound that forms the second layer 32 in the emission layer 30 may be the same.

In an implementation, the first layer 31 may include MgTe and the second layer 32 may include ZnTe. In this case, a band gap of MgTe is about 3.49 eV and a band gap of ZnTe is about 2.35 eV. Thus, a well layer may be formed in ZnTe having a relatively small band gap and electrons and holes may be collected therein. Light emission may occur from a combination of the electrons and holes. Such a light emitting element may emit light of a red color.

In some implementations, the first layer 31 may include MgSe and the second layer 32 may include ZnSe. In this case, a band gap of MgSe is about 3.60 eV, a band gap of ZnSe is about 2.82 eV. Such a light emitting element may emit light of a green color.

In some implementations, the first layer 31 may include MgS and the second layer 32 may include ZnS. In this case, a band gap of MgS is about 4.5 eV, a band gap of ZnS is between 3.5 eV and 3.9 eV. Such a light emitting element may emit light of a blue color.

The light emitting element according to the present exemplary embodiment may include a suitable material of the first layer 31 including magnesium and a suitable material of the second layer 32 including zinc such that the band gap of the first layer 31 is wider than that of the second layer 32.

Referring back to FIG. 1 and FIG. 2, the light emitting element according to the exemplary embodiment may include a hole transport layer 40 that is disposed between the first electrode 10 and the emission layer 30. The hole transport layer 40 may include an organic material or an inorganic material.

When the hole transport layer 40 includes an inorganic material, the inorganic material may be amorphous. The hole transport layer 40 may be, for example, a binary, ternary, or quaternary compound semiconductor formed by combining a material of groups 1 to 14 and a material of groups 15 to 17 in the periodic table of elements. In some implementations, the hole transport layer 40 may be a p-type semiconductor formed by doping an appropriate p-type element to such a material.

For example, the p-type hole transport layer 40 may include at least one of CuI, CuBr, CuCl, AgI, AgBr, AgCl, AuI, AuBr, and AuCl, which are doped with at least one selected from O, Se, S, and Te. In some implementations, the hole transport layer 40 may include at least one of ZnTe, ZnSe, ZnS, and ZnO which are doped with at least one selected from N, P, As, Sb, and Bi.

Referring to FIG. 1 and FIG. 2, the light emitting element according to the exemplary embodiment may include an electron transport layer 50 that is disposed between the second electrode 20 and the emission layer 30. The electron transport layer 50 may include an organic material or an inorganic material.

When the electron transport layer 50 includes an inorganic material, the inorganic material may be amorphous. The electron transport layer 50 may be, for example, a binary, ternary, or quaternary compound semiconductor formed by combining a material of groups 1 to 14 and a material of groups 15 to 17 in the periodic table of elements. In some implementations, the electron transport layer 50 may be an n-type semiconductor formed by doping an appropriate n-type element to such a material.

For example, the n-type electron transport layer 50 may include at least one of ZnTe, ZnSe, ZnS, and ZnO, which are doped with at least one of B, Al, Ga, In, and Tl.

The hole transport layer 40 and the electron transport layer 50 may include an organic material or an inorganic material. In some implementations, the hole transport layer 40 and the electron transport layer 50 may both include an inorganic material. In case of a light emitting element of such an exemplary embodiment, all layers including an emission layer may be made of an inorganic material. Accordingly, the light emitting element may have higher stability with respect to oxygen and heat compared to a light emitting element that includes an organic material.

The light emitting element may further include a hole injection layer disposed between the first electrode 10 and the hole transport layer 40 and an electron injection layer disposed between the second electrode 20 and the electron transport layer 50.

The hole injection layer and the electron injection layer may include a halide compound of a group 1 element or a group 2 element.

For example, the hole injection layer and the electron injection layer may include at least one selected from LiI, NaI, KI, RbI, and CsI.

As described, the light emitting element may be a quantum well having a structure in which the emission layer is formed by stacking an amorphous inorganic material. When the emission layer is made of an inorganic material, the light emitting element may be stable with respect to oxygen, moisture, and heat, compared to an existing organic light emitting element. In addition, when the emission layer is amorphous, the emission layer has no loss due to a crystal defect compared to existing general inorganic light emitting element, and may be capable of surface light emission.

Figure 3:
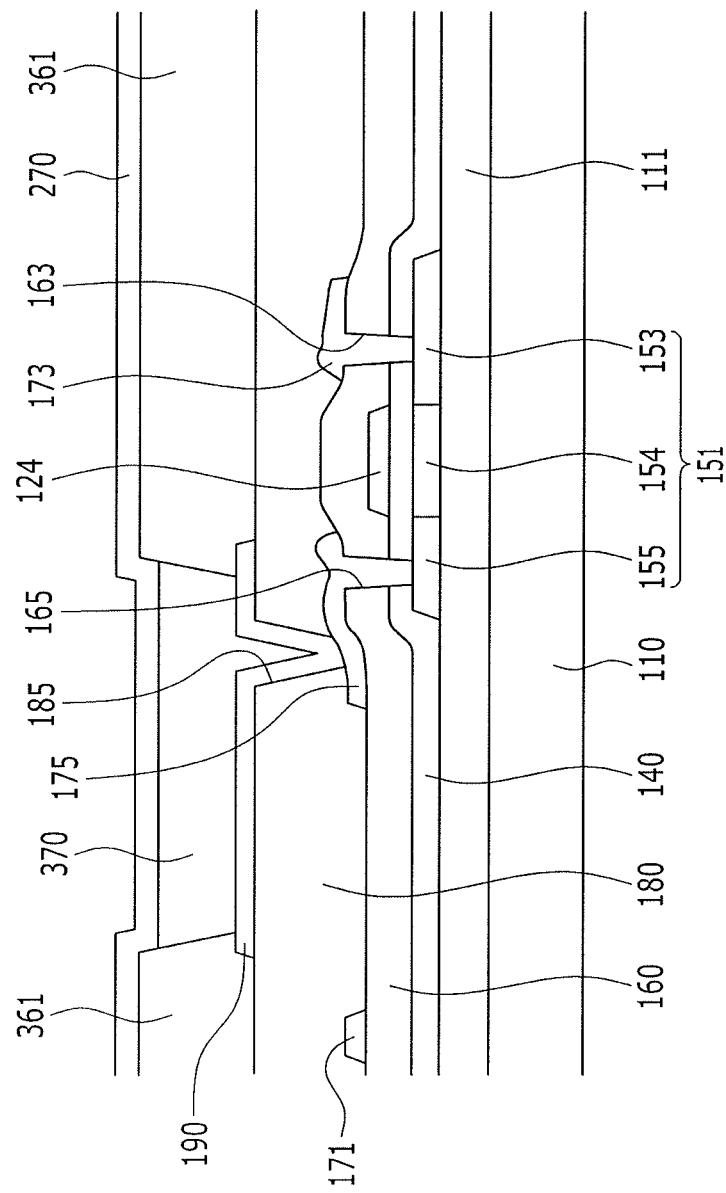
FIG. 3 illustrates a cross-sectional view of a display device according to an exemplary embodiment.

Hereinafter, a display device according to an exemplary embodiment will be described with reference to FIG. 3. FIG. 3 illustrates a cross-sectional view of a display device according to an exemplary embodiment.

Referring to FIG. 3, a blocking layer 111 that is made of a silicon oxide or a silicon nitride may be provided on a substrate 110.

A semiconductor layer 151 may be provided on the blocking layer 111. The semiconductor layer 151 may include a source area 153, a drain area 155, and a channel area 154. The channel area 154 may be disposed between the source area 153 and the drain area 155. The source area 153 and the drain area 155 may be doped with a p-type impurity.

A gate insulating layer 140 may be provided on the semiconductor layer 151 and the blocking layer 111. The gate insulating layer 140 may be made of a silicon oxide or a silicon nitride. A control electrode 124 may overlap the channel area 154 of the semiconductor layer 151. The control layer 124 may be provided on the gate insulating layer 140.

An interlayer insulating layer 160 may be provided on the control electrode 124 and the gate insulating layer 140. A first contact hole 165 and a second contact hole 163 may be provided in the interlayer insulating layer 160.

A data conductor that includes a data line 171, an input electrode 173, and an output electrode 175 may be provided on the interlayer insulating layer 160.

The output electrode 175 may be connected with the drain area 155 through the first contact hole 165. The input electrode 173 may be connected with the source area 153 through the second contact hole 163.

A passivation layer 180 may be provided on the data conductors 171, 173, and 175 and the interlayer insulating layer 160, and a contact hole 185 may be provided in the passivation layer 180.

A pixel electrode 190 may be provided in the passivation layer 180. The pixel electrode 190 may be connected with the output electrode 175 through the contact hole 185. A partition 361 may be provided on the passivation layer 180. A light emitting element layer 370 may be provided on the pixel electrode 190, and a common electrode 270 may be provided on the light emitting element layer 370. A light emitting element may include the pixel electrode 190, the light emitting element layer 370, and the common electrode 270.

The pixel electrode 190 may be an anode, which is a hole injection electrode, and may correspond to the first electrode 10 of FIG. 2. The common electrode 270 may be a cathode, which is an electron injection electrode, and may correspond to the second electrode 20 of FIG. 1 and FIG. 2. In some implementations, the pixel electrode 190 may be a cathode and the common electrode 270 may be an anode depending on a driving method of the display device.

The light emitting element layer 370 may include the emission layer 30 as described with reference to FIG. 1 and FIG. 2.

The above-described structure of the display device is an exemplary structure. The light emitting element according to the present exemplary embodiment may be applied to a display device having a different structure.

By way of summation and review, an organic light emitting diode display device is a self-emitting display element that has advantages of a wide viewing angle, excellent contrast, and a fast response time.

The organic light emitting diode display device includes an organic light emitting element for light emission, and the organic light emitting element forms excitons from combination of electrons injected from one electrode and holes injected from another electrode in an emission layer, and the excitons emit energy such that light is emitted.

However, since the emission layer of the organic light emitting diode display device is made of an organic material, the emission layer is subject to deterioration by oxygen, moisture, and heat. In general, in case of an organic light emitting element, an element is formed by stacking an organic material, and an emission layer that also includes an organic material. Such an organic light emitting element is capable of surface light emission. However, because the organic light emitting element including the organic material is subject to deterioration by oxygen, moisture, and heat, the organic light emitting element may have a short life span, and may not endure a high-temperature plasma process.

In the case of a general inorganic light emitting element (e.g., an LED), an element is formed by using a quantum well that includes an inorganic material. However, in a general LED, layers including an emission layer are mostly monocrystalline layers, which involve a long process time and an expensive unit cost. Further, while the general inorganic light emitting element is capable of dot light emission, the general inorganic light emitting element may not be appropriate for a display device, but instead, is more appropriate for general lighting.

The emission layer of the light emitting element according to the present exemplary embodiment is not monocrystalline like the general inorganic light emitting element, but is amorphous even through the light emitting element is made of an inorganic material like the general inorganic light emitting element. Thus, there is no need to grow the substrate to be monocrystalline and no need of consideration of grid match or the like, and accordingly, a material can be selected with less restriction.

In addition, the light emitting element according to the present exemplary embodiment is capable of surface light emission like the organic light emitting element and is resistant to oxygen, moisture, and heat compared to the organic light emitting element that includes an organic material because the emission layer of the light emitting element includes an inorganic material. Further, the element can be formed using a high-temperature plasma method and a thermal evaporation method.

Accordingly, embodiments provide a light emitting element having high stability with respect to an external environment, and a display device including the same. The light emitting element and the display device according to the exemplary embodiments are resistant to oxygen, moisture, and heat.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope thereof as set forth in the following claims.

What is claimed is:

1. A light emitting element, comprising:
   a first electrode;
   a second electrode overlapping the first electrode; and
   an emission layer between the first electrode and the second electrode,
   wherein the emission layer includes a quantum well having at least three layers, the at least three layers including a first layer and a second layer, each having a different band gap,
   the first layer includes magnesium, and the second layer includes zinc, and
   the first layer and the second layer are amorphous.

2. The light emitting element as claimed in claim 1, wherein the at least three layers includes three or more layers in an odd number, the three or more layers being formed by alternating the first layer and the second layer.

3. The light emitting element as claimed in claim 2, wherein the first layer is the bottommost and the topmost layer of the plurality of layers.

4. The light emitting element as claimed in claim 1, wherein the first layer is at least one selected from MgTe, MgSe, MgS, and MgO.

5. The light emitting element as claimed in claim 1, wherein the second layer is at least one selected from ZnTe, ZnSe, ZnS, and ZnO.

6. The light emitting element as claimed in claim 1, wherein the second layer further includes at least one of magnesium and beryllium.

7. The light emitting element as claimed in claim 6, wherein the second layer is at least one selected from MgZnTe, MgZnSe, MgZnS, MgZnO, BeZnTe, BeZnSe, BeZnS, and BeZnO.

8. The light emitting element as claimed in claim 1, wherein the second layer includes at least one of cadmium, mercury, strontium, and barium.

9. The light emitting element as claimed in claim 8, wherein the second layer is at least one selected from CdZnTe, CdZnSe, CdZnS, CdZnO, HgZnTe, HgZnSe, HgZnS, HgZnO, SrZnTe, SrZnSe, SrZnS, SrZnO, BaZnTe, BaZnSe, BaZnS, and BaZnO.

10. The light emitting element as claimed in claim 1, further comprising:
    a hole transport layer between the first electrode and the emission layer; and
    an electron transport layer between the second electrode and the emission layer.

11. The light emitting element as claimed in claim 10, wherein at least one of the hole transport layer and the electron transport layer includes an inorganic material.

12. The light emitting element as claimed in claim 11, wherein:
    the hole transport layer includes at least one of CuI, CuBr, CuCl, AgI, AgBr, AgCl, AuI, AuBr, and AuCl, wherein the at least one of CuI, CuBr, CuCl, AgI, AgBr, AgCl, AuI, AuBr, and AuCl is doped with at least one selected from O, Se, S, and Te, or,
    the hole transport layer includes at least one of ZnTe, ZnSe, ZnS, and ZnO, wherein the at least one of ZnTe, ZnSe, ZnS, and ZnO is doped with at least one selected from N, P, As, Sb, and Bi.

13. The light emitting element as claimed in claim 11, wherein the electron transport layer includes at least one of ZnTe, ZnSe, ZnS, and ZnO, wherein the at least one of ZnTe, ZnSe, ZnS, and ZnO is doped with at least one selected from B, Al, Ga, In, and Tl.

14. A display device comprising:
    a substrate;
    a transistor on the substrate; and
    a light emitting element connected with the transistor,
    wherein the light emitting element includes:
    a first electrode;
    a second electrode that overlaps the first electrode; and
    an emission layer between the first electrode and the second electrode,
    wherein the emission layer includes a quantum well having at least three layers, the at least three layers including a first layer and a second layer, each having a different band gap,
    the first layer includes magnesium and the second layer includes zinc, and
    the first layer and the second layer are amorphous.

15. The display device as claimed in claim 14, wherein at least three layers includes three or more odd-numbered plurality of layers formed by alternating the first layer and the second layer.

16. The display device as claimed in claim 14, wherein the first layer includes at least one selected from MgTe, MgSe, MgS, and MgO.

17. The display device as claimed in claim 14, wherein the second layer is at least one selected from ZnTe, ZnSe, ZnS, ZnO, MgZnTe, MgZnSe, MgZnS, MgZnO, BeZnTe, BeZnSe, BeZnS, BeZnO, CdZnTe, CdZnSe, CdZnS, CdZnO, HgZnTe, HgZnSe, HgZnS, HgZnO, SrZnTe, SrZnSe, SrZnS, SrZnO, BaZnTe, BaZnSe, BaZnS, and BaZnO.

18. The display device as claimed in claim 14, further including:
    a hole transport layer between the first electrode and the emission layer; and
    an electron transport layer between the second electrode and the emission layer.

19. The display device as claimed in claim 18, wherein at least one of the hole transport layer and the electron transport layer includes an inorganic material.

20. The display device as claimed in claim 19, wherein:
    the hole transport layer includes at least one of CuI, CuBr, CuCl, AgI, AgBr, AgCl, AuI, AuBr, and AuCl, wherein the at least one of CuI, CuBr, CuCl, AgI, AgBr, AgCl, AuI, AuBr, and AuCl is doped with at least one selected from O, Se, S, and T, or
    the hole transport layer includes at least one of ZnTe, ZnSe, ZnS, and ZnO, wherein the at least one of ZnTe, ZnSe, ZnS, and ZnO is doped with at least one selected from N, P, As, Sb, and Bi, and
    the electron transport layer includes at least one of ZnTe, ZnSe, ZnS, and ZnO, wherein the at least one of ZnTe, ZnSe, ZnS, and ZnO is doped with at least one selected from B, Al, Ga, In, and Tl.

* * * * *